(12) United States Patent
Choi et al.

(10) Patent No.: US 11,845,113 B2
(45) Date of Patent: Dec. 19, 2023

(54) UNIT FOR RECYCLING TREATING LIQUID OF SUBSTRATE AND APPARATUS FOR TREATING SUBSTRATE WITH THE UNIT

(71) Applicant: SEMES Co., Ltd., Chungcheongnam-do (KR)

(72) Inventors: Ye Jin Choi, Seoul (KR); Byung Sun Bang, Gyeonggi-do (KR); Tae Ho Kang, Gyeonggi-do (KR); Jong Won Moon, Chungcheongnam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 192 days.

(21) Appl. No.: 17/403,063

(22) Filed: Aug. 16, 2021

(65) Prior Publication Data

US 2022/0168784 A1 Jun. 2, 2022

(30) Foreign Application Priority Data

Nov. 27, 2020 (KR) .................. 10-2020-0162008

(51) Int. Cl.
| | |
|---|---|
| *H01L 21/67* | (2006.01) |
| *B08B 3/10* | (2006.01) |
| *B08B 3/04* | (2006.01) |
| *B08B 3/08* | (2006.01) |
| *B08B 3/02* | (2006.01) |

(52) U.S. Cl.
CPC ............ *B08B 3/10* (2013.01); *B08B 3/022* (2013.01); *B08B 3/041* (2013.01); *B08B 3/08* (2013.01); *H01L 21/67051* (2013.01)

(58) Field of Classification Search
CPC ......... H01L 21/64017; H01L 21/67023; H01L 21/67028; H01L 21/6704; H01L 21/67051;

(Continued)

(56) References Cited

U.S. PATENT DOCUMENTS

| | | |
|---|---|---|
| 6,612,315 B2 | 9/2003 | Pascal et al. |
| 8,721,834 B2 | 5/2014 | Koo et al. |

(Continued)

FOREIGN PATENT DOCUMENTS

| | | |
|---|---|---|
| JP | 01231964 A | 9/1989 |
| JP | 05259060 A | 10/1993 |

(Continued)

OTHER PUBLICATIONS

Machine Translation of Lee et al., KR20200040538A, Apr. 2020. (Year: 2020).*

(Continued)

*Primary Examiner* — David G Cormier
(74) *Attorney, Agent, or Firm* — RatnerPrestia

(57) ABSTRACT

A substrate treating liquid recovery unit with improved cleaning efficiency and a substrate treating apparatus including the same are provided. The substrate treating apparatus includes a substrate support unit; and a substrate treating liquid recovery unit surrounding the substrate support unit, for recovering a substrate treating liquid, and including a first recovery container, wherein the first recovery container comprises a first base for discharging the substrate treating liquid to an outside through a first recovery line, and including a third portion disposed on one side of the substrate support unit and a fourth portion disposed on the other side of the substrate support unit; a first sidewall extending upwardly from one end of the first base; a first upper plate extending obliquely and upwardly from an end of the first sidewall; and a first inner wall extending upwardly from the other end of the first base.

18 Claims, 12 Drawing Sheets

(58) Field of Classification Search
CPC ......... H01L 21/67063; H01L 21/67075; H01L 21/6708; H01L 21/67017
See application file for complete search history.

(56) References Cited

U.S. PATENT DOCUMENTS

2009/0095325 A1    4/2009  Choi et al.
2014/0238443 A1*   8/2014  Lee .................... H01L 21/6708
                                                              239/548

FOREIGN PATENT DOCUMENTS

| JP | 2007189232 A | | 7/2007 |
|---|---|---|---|
| JP | 2009094516 A | | 4/2009 |
| JP | 2009110985 A | | 5/2009 |
| JP | 2018018855 A | | 2/2018 |
| KR | 100674391 B1 | | 1/2007 |
| KR | 20070034653 A | | 3/2007 |
| KR | 20090037706 A | | 4/2009 |
| KR | 20200029248 A | | 3/2020 |
| KR | 20200040538 A | * | 4/2020 |

OTHER PUBLICATIONS

Japanese Notice of Reasons for Refusal for Japanese Application No. 2021-128156, dated Aug. 30, 2022, with translation, 6 pages.
Korean Written Decision on Registration for Korean Application No. 10-2020-0162008, dated Aug. 17, 2023 with translation, 4 pages.

* cited by examiner

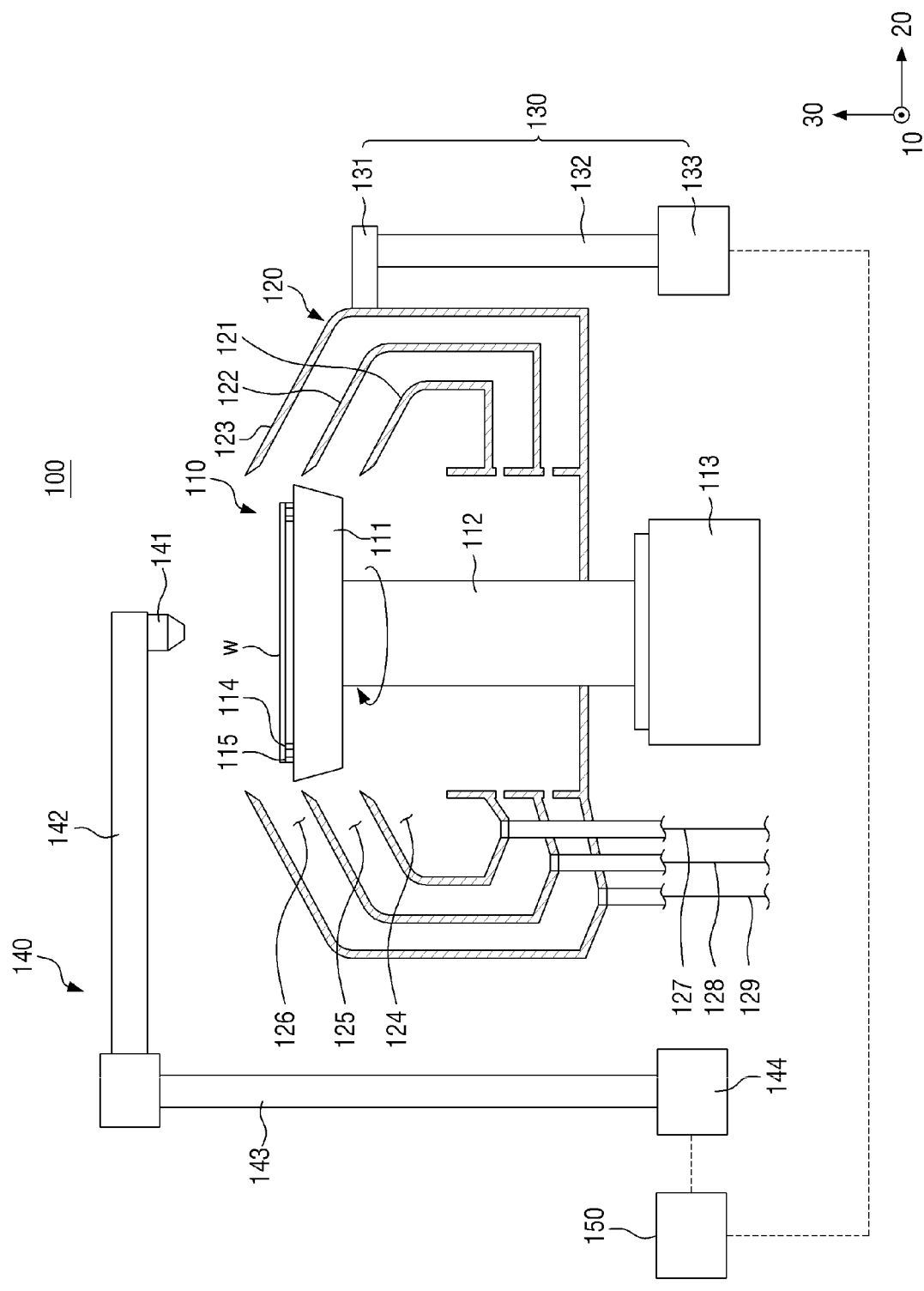
[FIG. 1]

[FIG. 2]
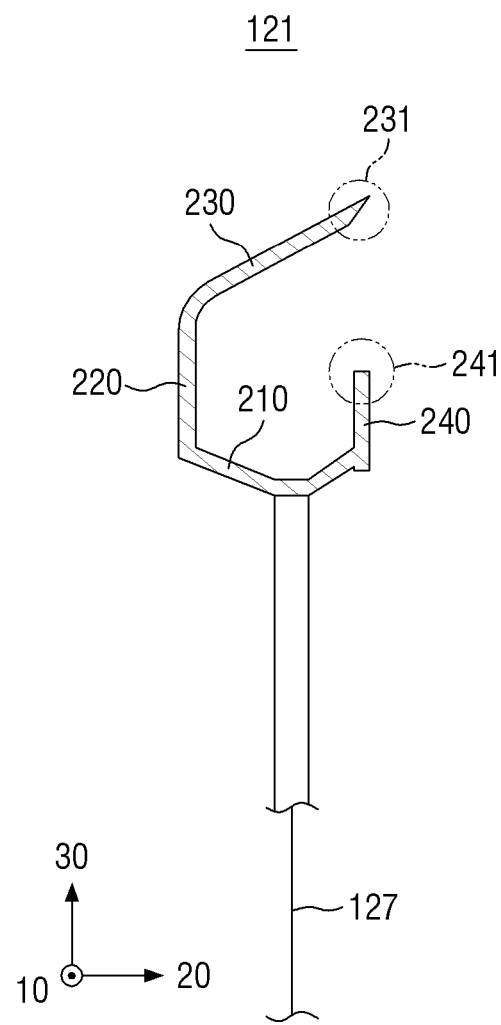

[FIG. 3]
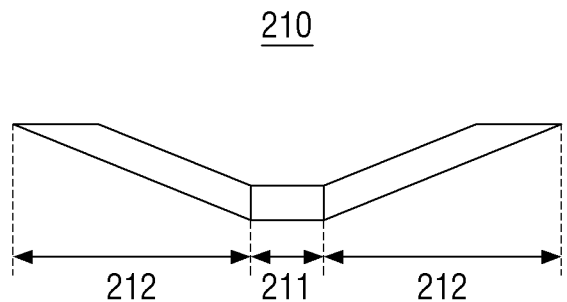
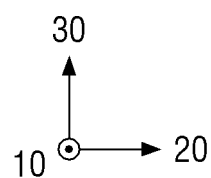
[FIG. 4]
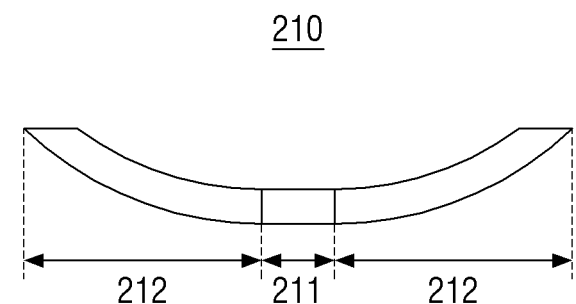
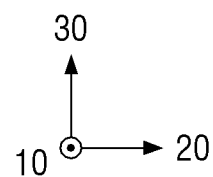

[FIG. 5]
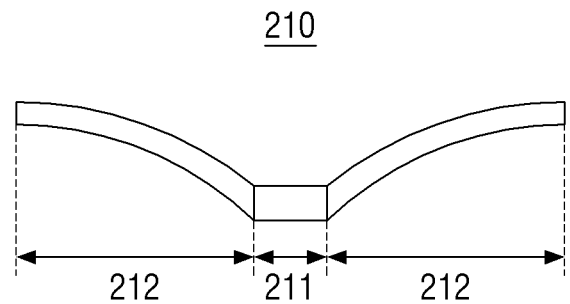
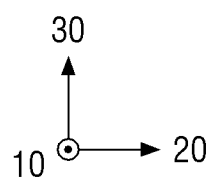
[FIG. 6]
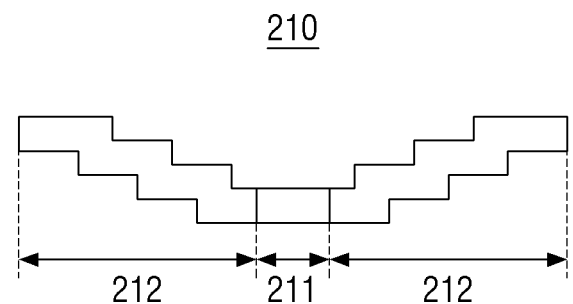
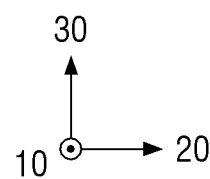

[FIG. 7]
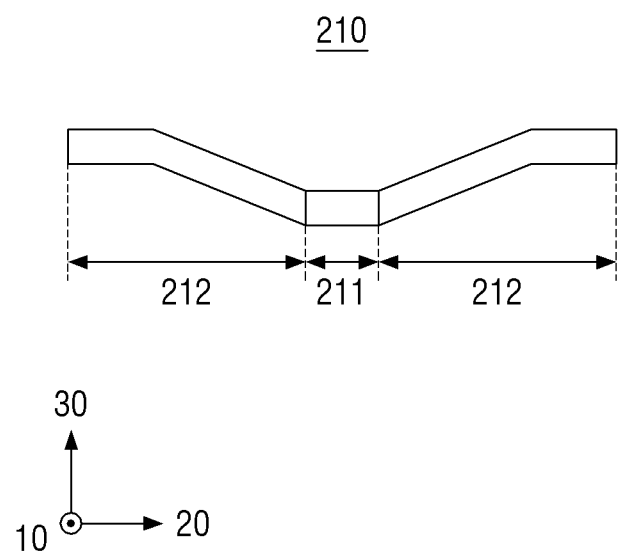

[FIG. 8]
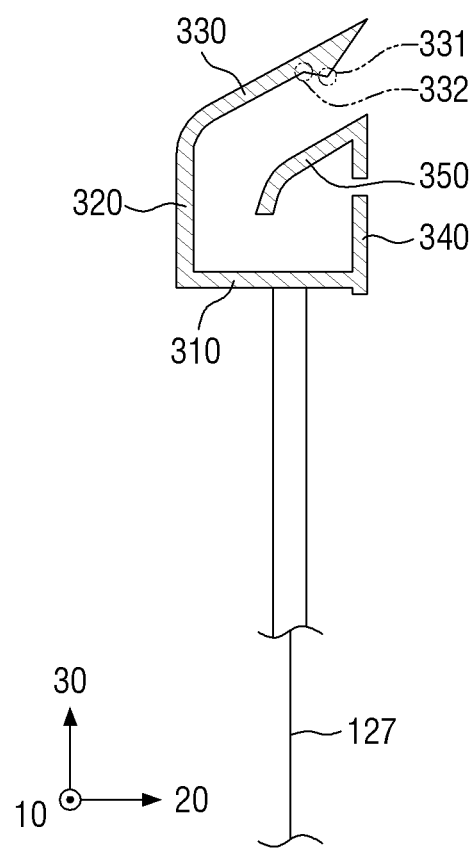

[FIG. 9]
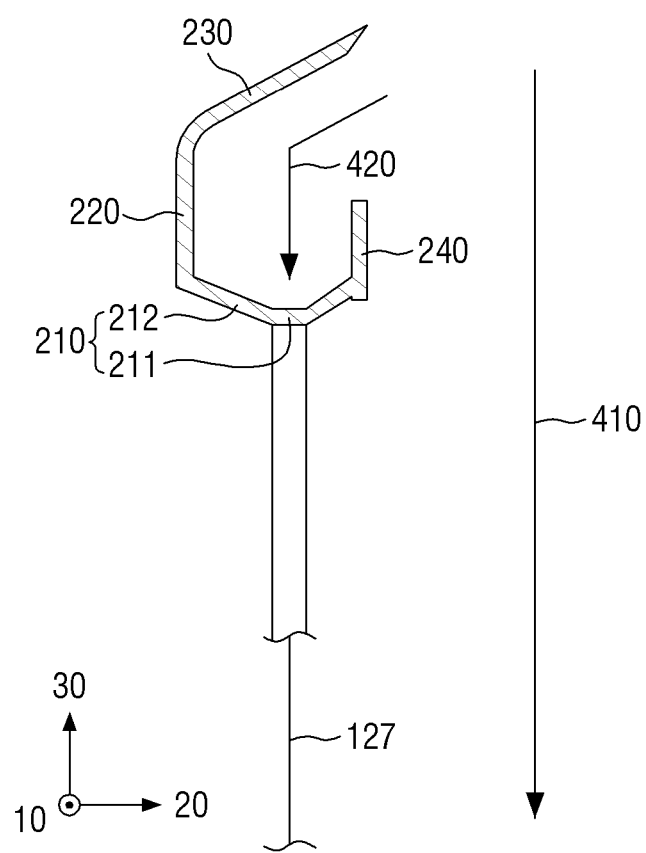

[FIG. 10]
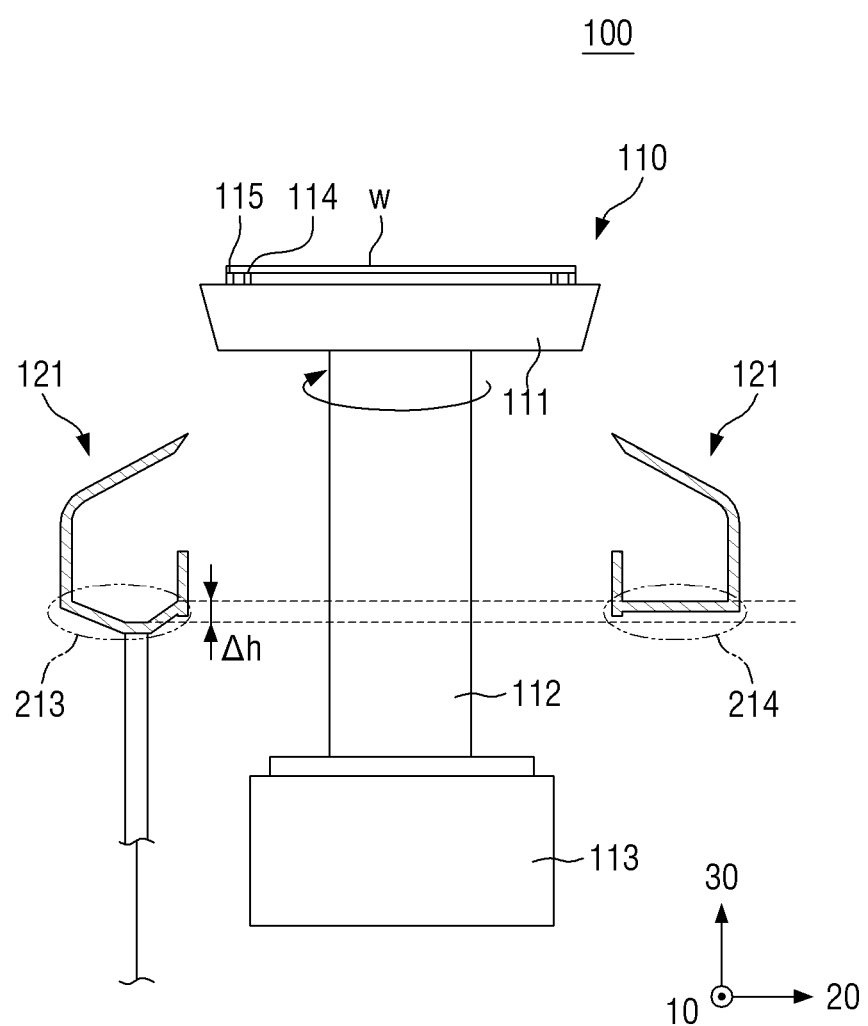

[FIG. 11]
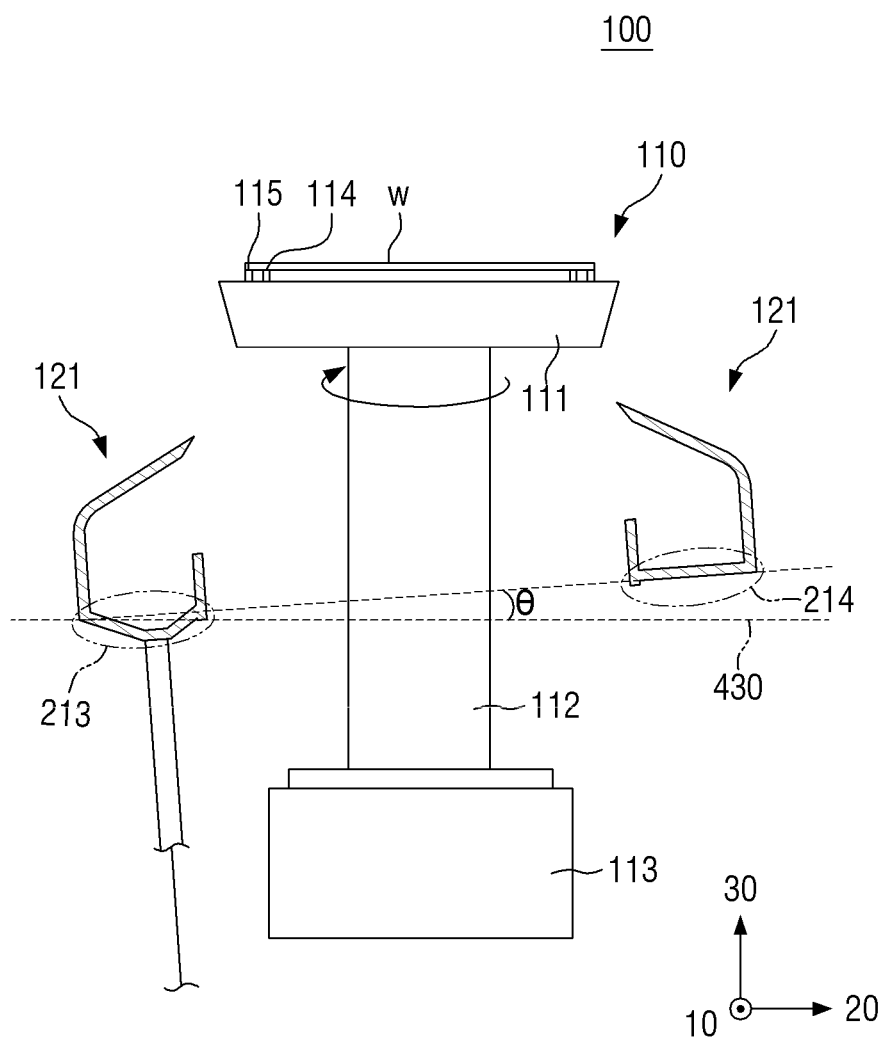

[FIG. 12]
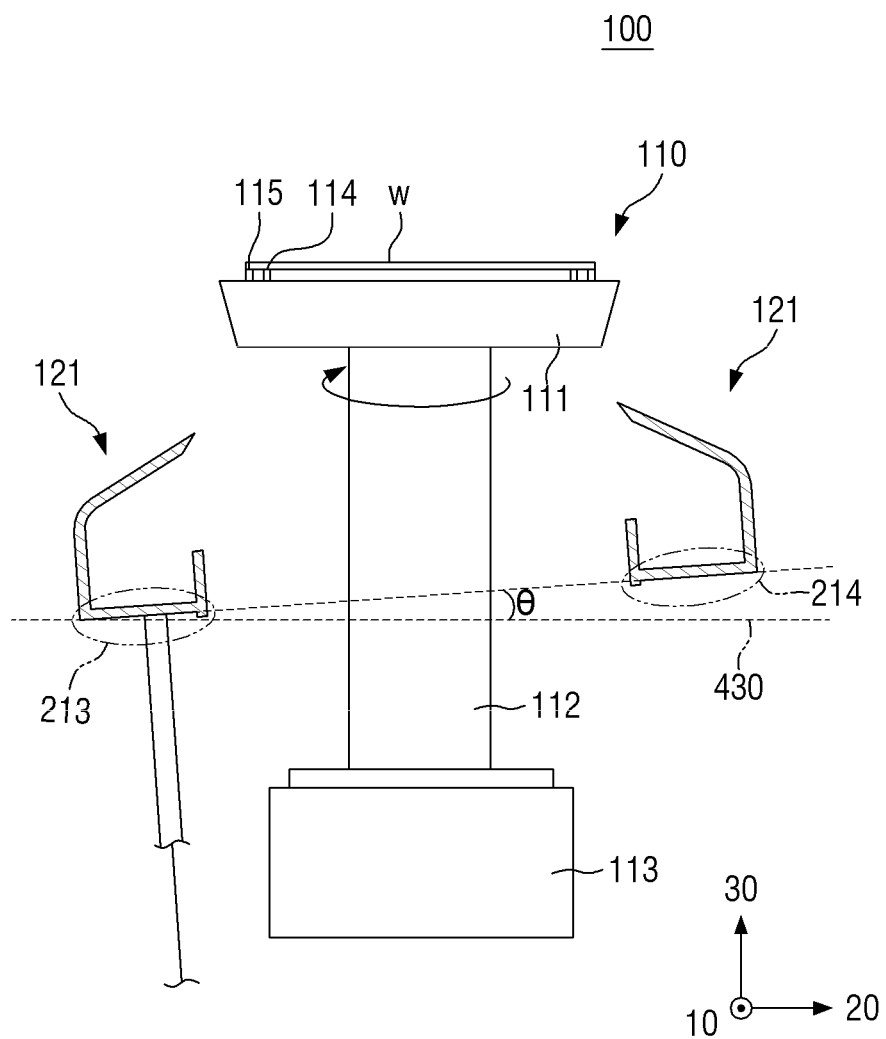

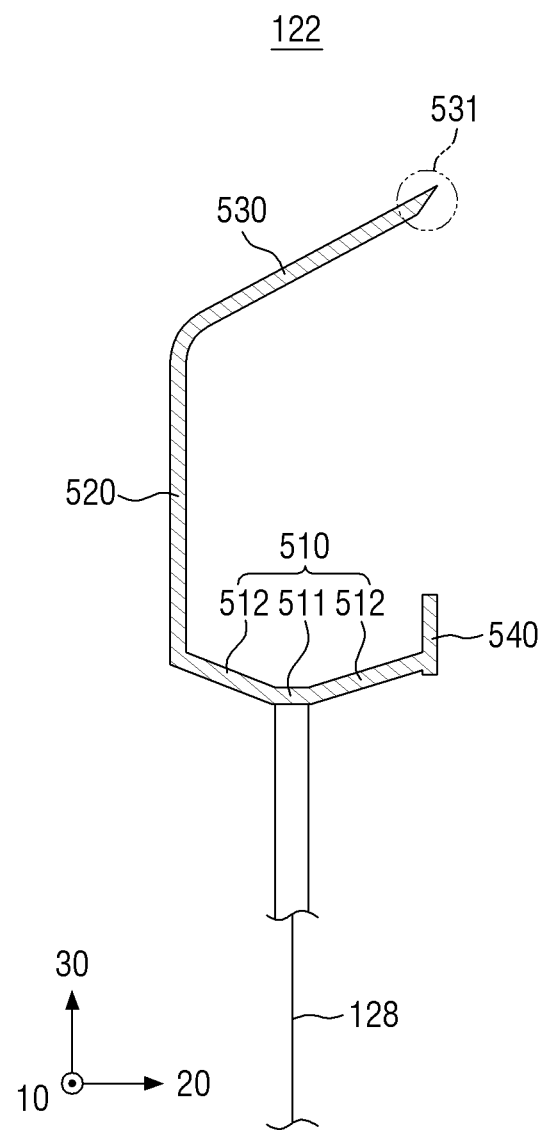
[FIG. 13]

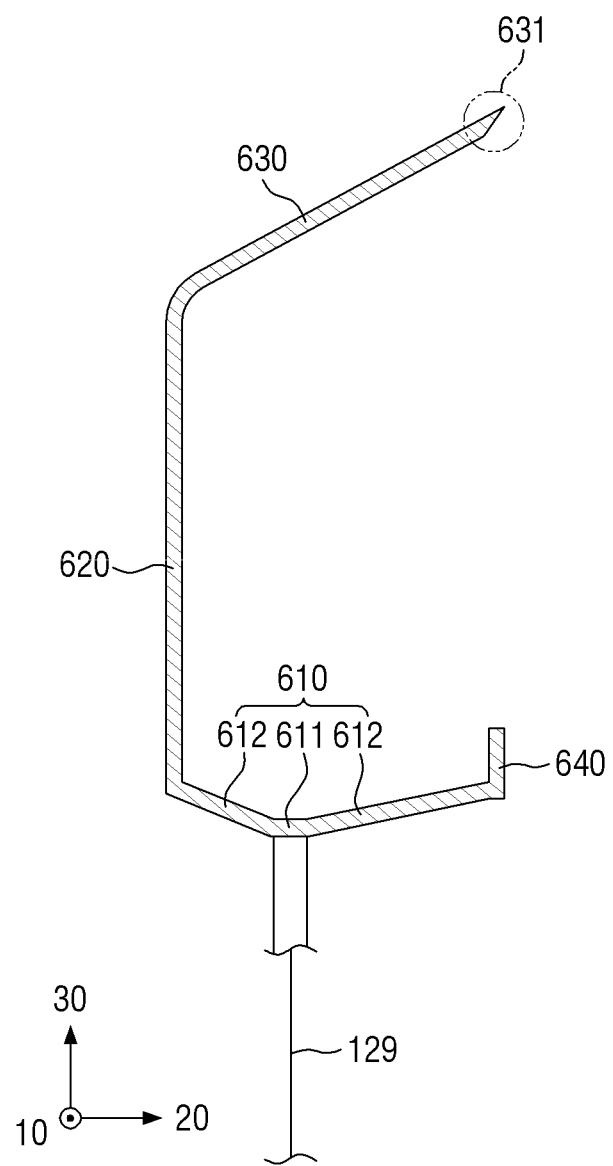
[FIG. 14]

UNIT FOR RECYCLING TREATING LIQUID OF SUBSTRATE AND APPARATUS FOR TREATING SUBSTRATE WITH THE UNIT

CROSS REFERENCE TO RELATED APPLICATION

This application claims the benefit of Korean Patent Application No. 10-2020-0162008, filed on Nov. 27, 2020, in the Korean Intellectual Property Office, the disclosure of which is incorporated herein by reference in its entirety.

1. FIELD OF THE INVENTION

The present invention relates to a unit for recovering a substrate treating liquid and a substrate treating apparatus having the same. More particularly, it relates to a unit for recovering a substrate treating liquid used for cleaning a substrate, and a substrate treating apparatus having the same.

2. DESCRIPTION OF THE RELATED ART

The process of manufacturing a semiconductor device may be continuously performed in a semiconductor manufacturing facility, and may be divided into a pre-process and a post-process. A semiconductor manufacturing facility may be installed in a space generally defined as a FAB for manufacturing semiconductor devices.

The pre-process refers to a process of forming a circuit pattern on a wafer to complete a chip. The pre-process may include a deposition process for forming a thin film on a wafer, a photo-lithography process for transferring a photo resist onto a thin film using a photo mask, an etching process for selectively removing unnecessary parts using chemical substances or reactive gases to form a circuit pattern on a wafer, an ashing process for removing the photo resist remaining after etching, an ion implantation process for implanting ions into the portion connected to the circuit pattern to have characteristics of an electronic device, a cleaning process for removing contamination sources from the wafer, and the like.

The post-process refers to the process of evaluating the performance of the product finished through the pre-process. The post-process may include a wafer inspection process that checks whether each chip on the wafer operates and selects good and bad products, a package process that cuts and separates each chip through dicing, die bonding, wire bonding, molding and marking to have the shape of the product, and the final inspection process that finally checks the product characteristics and reliability through electrical property inspection, and burn-in inspection.

SUMMARY OF THE INVENTION

A bowl is to recover a chemical used for cleaning a substrate (e.g., a wafer). The bowl may be installed on the side surface of the substrate support member supporting the substrate in order to perform this function.

The bowl may be cleaned using de-ionized water (DIW) used to clean the substrate. However, the conventional bowl has a structure, in which the chemical can remain. When the chemical remains inside the bowl, particles may be generated on the substrate through fume or scattering, which may result in defects in the substrate.

An aspect of the present invention is to provide a substrate treating liquid recovery unit with improved cleaning efficiency and a substrate treating apparatus having the same.

The problems of the present invention are not limited to the problems mentioned above, and other problems not mentioned will be clearly understood by those skilled in the art from the following description.

One aspect of the substrate treating apparatus of the present invention for achieving the above object comprises a substrate support unit for supporting a substrate; and a substrate treating liquid recovery unit surrounding the substrate support unit, for recovering a substrate treating liquid discharged to the substrate, and including a first recovery container, wherein the first recovery container comprises a first base for discharging the substrate treating liquid to an outside through a first recovery line, and including a third portion disposed on one side of the substrate support unit and a fourth portion disposed on the other side of the substrate support unit; a first sidewall extending upwardly from one end of the first base; a first upper plate extending obliquely and upwardly from an end of the first sidewall; and a first inner wall extending upwardly from the other end of the first base, wherein the third portion and the fourth portion have different heights.

Wherein the fourth portion may be higher than the third portion.

Wherein the third portion may be connected to the first recovery line.

Wherein the third portion may comprise a first portion connected to the first recovery line installed at a lower portion; and a second portion adjacent to the first portion, wherein at least a part of the second portion is formed to be inclined downwardly in a direction, in which the first portion is located.

Wherein the second portion may be formed to be inclined downwardly in a straight shape, formed to be inclined downwardly in a curved shape, or formed to be inclined downwardly in a step shape.

Wherein an inclination angle of the second portion with respect to the first portion may be 20 degrees or more and 70 degrees or less.

Wherein the first base may be installed in a vertical direction with respect to a height direction of the substrate support unit, or installed to be tilted. That is, an angle formed between a longitudinal direction of the first base and a height direction of the substrate support unit may be 90 degrees or less.

Wherein, when the first base is installed to be tilted, an angle formed between a longitudinal direction of the first base and a height direction of the substrate support unit may be 15 degrees or less.

Wherein an end of the first upper plate may have a narrower width toward an end.

Wherein the substrate treating liquid recovery unit may further comprise a second recovery container surrounding the first recovery container; and a third recovery container surrounding the second recovery container.

Wherein the first recovery container, the second recovery container, and the third recovery container may recover different substrate treating liquids.

Wherein the first recovery container recovers water as the substrate treating liquid, and the first inner wall may not be coupled to a guide wall that is formed to be inclined downwardly in an inward direction.

Wherein the second recovery container comprises a second base for discharging the substrate treating liquid to an outside through a second recovery line, and including a fifth portion disposed on one side of the substrate support unit and a sixth portion disposed on the other side of the substrate support unit; a second sidewall extending upwardly from one end of the second base; a second upper plate extending obliquely and upwardly from an end of the second sidewall; and a second inner wall extending upwardly from the other end of the second base, wherein the fifth portion and the sixth portion may have different heights.

Wherein the third recovery container comprises a third base for discharging the substrate treating liquid to an outside through a third recovery line, and including a seventh portion disposed on one side of the substrate support unit and an eighth portion disposed on the other side of the substrate support unit; a third sidewall extending upwardly from one end of the third base; a third upper plate extending obliquely and upwardly from an end of the third sidewall; and a third inner wall extending upwardly from the other end of the third base, wherein the seventh portion and the eighth portion may have different heights.

The substrate treating apparatus may further comprise an elevating unit for elevating the substrate treating liquid recovery unit.

Wherein the elevating unit may adjust a height of the substrate treating liquid recovery unit according to a rotation speed of the substrate support unit.

Wherein the substrate treating apparatus may be a facility for wet cleaning the substrate.

Wherein at least one of an injection unit used for cleaning the substrate and a nozzle installed in the substrate support unit may be used when cleaning the substrate treating liquid recovery unit.

Another aspect of the substrate treating apparatus of the present invention for achieving the above object comprises a substrate support unit for supporting a substrate; and a substrate treating liquid recovery unit surrounding the substrate support unit, for recovering a substrate treating liquid discharged to the substrate, and including a first recovery container, wherein the first recovery container comprises a first base for discharging the substrate treating liquid to an outside through a first recovery line, and including a third portion disposed on one side of the substrate support unit and a fourth portion disposed on the other side of the substrate support unit; a first sidewall extending upwardly from one end of the first base; a first upper plate extending obliquely and upwardly from an end of the first sidewall; and a first inner wall extending upwardly from the other end of the first base, wherein the third portion and the fourth portion have different heights, wherein an angle formed between a longitudinal direction of the first base and a height direction of the substrate support unit is less than 90 degrees.

One aspect of the substrate treating liquid recovery unit of the present invention for achieving the above is the substrate treating liquid recovery unit surrounds a substrate support unit for supporting a substrate and recovers a substrate treating liquid discharged to the substrate, wherein the substrate treating liquid recovery unit comprises a first recovery container, wherein the first recovery container comprises a first base for discharging the substrate treating liquid to an outside through a first recovery line, and including a third portion disposed on one side of the substrate support unit and a fourth portion disposed on the other side of the substrate support unit; a first sidewall extending upwardly from one end of the first base; a first upper plate extending obliquely and upwardly from an end of the first sidewall; and a first inner wall extending upwardly from the other end of the first base, wherein the third portion and the fourth portion have different heights.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which:

FIG. 1 is a cross-sectional view schematically illustrating an internal structure of a substrate treating apparatus according to an embodiment of the present invention;

FIG. 2 is a cross-sectional view specifically illustrating an internal structure of a first recovery container of a substrate treating liquid recovery unit constituting a substrate treating apparatus according to an exemplary embodiment of the present invention;

FIG. 3 is a first exemplary view illustrating various embodiments of a first base constituting the first recovery container shown in FIG. 2;

FIG. 4 is a second exemplary view illustrating various embodiments of a first base constituting the first recovery container shown in FIG. 2;

FIG. 5 is a third exemplary view illustrating various embodiments of the first base constituting the first recovery container shown in FIG. 2;

FIG. 6 is a fourth exemplary view illustrating various embodiments of the first base constituting the first recovery container shown in FIG. 2;

FIG. 7 is a fifth exemplary view illustrating various embodiments of the first base constituting the first recovery container shown in FIG. 2;

FIG. 8 is a cross-sectional view showing the internal structure of the conventional first recovery container;

FIG. 9 is a view for describing the effect of the first recovery container installed according to an embodiment of the present invention;

FIG. 10 is a first exemplary view illustrating various embodiments of a first recovery container constituting a substrate treating apparatus according to an embodiment of the present invention;

FIG. 11 is a second exemplary view illustrating various embodiments of a first recovery container constituting a substrate treating apparatus according to an embodiment of the present invention;

FIG. 12 is a third exemplary view illustrating various embodiments of the first recovery container constituting the substrate treating apparatus according to the embodiment of the present invention;

FIG. 13 is a cross-sectional view specifically illustrating an internal structure of a second recovery container among the substrate treating liquid recovery units constituting the substrate treating apparatus according to the exemplary embodiment of the present invention; and FIG. 14 is a cross-sectional view specifically illustrating an internal structure of a third recovery container among the substrate treating liquid recovery units constituting the substrate treating apparatus according to the exemplary embodiment of the present invention.

DETAILED DESCRIPTION OF THE INVENTION

Hereinafter, preferred embodiments of the present invention will be described in detail with reference to the accompanying drawings. Advantages and features of the present invention, and methods for achieving them will be clarified with reference to embodiments described below in detail together with the accompanying drawings. However, the present invention is not limited to the embodiments disclosed below, but may be implemented in various different forms, and only the embodiments allow the publication of the present invention to be complete, and are provided to fully inform those skilled in the technical field to which the present invention pertains of the scope of the invention, and the invention is only defined by the scope of the claims. The same reference numerals refer to the same elements throughout the specification.

When elements or layers are referred to as "on" or "above" of other elements or layers, it includes not only when directly above of the other elements or layers, but also other elements or layers intervened in the middle. On the other hand, when elements are referred to as "directly on" or "directly above," it indicates that no other element or layer is intervened therebetween.

The spatially relative terms "below," "beneath," "lower," "above," "upper," etc., as shown in figures, can be used to easily describe the correlation of components or elements with other components or elements. The spatially relative terms should be understood as terms including the different direction of the element in use or operation in addition to the direction shown in the figure. For example, if the element shown in the figure is turned over, an element described as "below" or "beneath" the other element may be placed "above" the other element. Accordingly, the exemplary term "below" can include both the directions of below and above. The element can also be oriented in other directions, so that spatially relative terms can be interpreted according to the orientation.

Although the first, second, etc. are used to describe various components, elements and/or sections, these components, elements and/or sections are not limited by these terms. These terms are only used to distinguish one component, element, or section from another component, element or section. Therefore, first component, the first element or first section mentioned below may be a second component, second element, or second section within the technical spirit of the present invention.

The terminology used herein is for describing the embodiments and is not intended to limit the present invention. In the present specification, the singular form also includes the plural form unless otherwise specified in the phrase. As used herein, "comprises" and/or "comprising" means that the elements, steps, operations and/or components mentioned above do not exclude the presence or additions of one or more other elements, steps, operations and/or components.

Unless otherwise defined, all terms (including technical and scientific terms) used in the present description may be used with meanings that can be commonly understood by those of ordinary skill in the art to which the present invention belongs. In addition, terms defined in a commonly used dictionary are not interpreted ideally or excessively unless explicitly defined specifically.

Hereinafter, exemplary embodiments of the present invention will be described in detail with reference to the accompanying drawings, and in the description with reference to the accompanying drawings, the same or corresponding elements are assigned the same reference numbers regardless of reference numerals, and the description overlapped therewith will be omitted.

The present invention relates to a substrate treating liquid recovery unit with improved cleaning efficiency and a substrate treating apparatus having the same. Hereinafter, the present invention will be described in detail with reference to drawings and the like.

FIG. 1 is a cross-sectional view schematically illustrating an internal structure of a substrate treating apparatus according to an embodiment of the present invention.

Referring to FIG. 1, a substrate treating apparatus 100 may include a substrate support unit 110, a substrate treating liquid recovery unit 120, an elevating unit 130, an injection unit 140, and a control unit 150.

The substrate treating apparatus 100 treats the substrate W using a chemical. The substrate treating apparatus 100 may be implemented as a wet cleaning system.

The chemical is used to treat the substrate W. Such a chemical may be a liquid material (e.g., an organic solvent) or a gaseous material. A chemical used for bowl cleaning may generate a lot of fumes due to its strong volatility or may contain high-resistance materials due to its high viscosity. The chemical may be selected from, for example, a material containing a sulfuric acid component (e.g., SPM containing a sulfuric acid component and a hydrogen peroxide component), a material containing an aqueous ammonia component, a material containing a hydrofluoric acid component, a material containing a phosphoric acid component, a material containing an IPA (Iso-Propyl Alcohol) component and the like.

In the present embodiment, rinse detergent, and water (e.g., de-ionized water (DIW)) may also be used to treat the substrate W. Hereinafter, those used to treat the substrate W (chemical, rinse detergent, water, etc.) will be defined as a substrate treating liquid.

The substrate support unit 110 supports the substrate W. The substrate support unit 110 may rotate the substrate W in a direction perpendicular to the third direction 30 (first direction 10 or second direction 20) when treating the substrate W. The substrate support unit 110 may be disposed inside the substrate treating liquid recovery unit 120 to recover the substrate treating liquid used in treating the substrate W.

The substrate support unit 110 may include a spin head 111, a rotation shaft 112, a rotation driving unit 113, a support pin 114, and a guide pin 115.

The spin head 111 rotates along the rotation direction (the first direction 10 and the second direction 20) of the rotation shaft 112. When the substrate W is seated in the upper portion of the spin head 111, the spin head 111 may rotate along the rotation direction of the rotation shaft 112.

The spin head 111 may be provided to have the same shape as that of the substrate W. The spin head 111 may be provided, for example, in a circular cross-section. However, the present embodiment is not limited thereto. The spin head 111 may have a polygonal cross-section or an elliptical cross-section. Meanwhile, the spin head 111 may be provided to have a shape different from that of the substrate W.

The rotation shaft 112 is coupled to the spin head 111 and the rotation driving unit 113 through both ends, respectively. The rotation shaft 112 may rotate with respect to the central axis by the rotational force of the rotation driving unit 113. When the rotational force of the rotation shaft 112 is transmitted to the spin head 111, the spin head 111 rotates, and accordingly, the substrate W fixed on the spin head 111 may also rotate.

The support pin 114 and the guide pin 115 fix the substrate W on the spin head 111. Specifically, the support pin 114 supports the bottom surface of the substrate W on the spin head 111, and the guide pin 115 supports the side surface of the substrate W. A plurality of support pins 114 and guide pins 115 may be respectively installed on the spin head 111.

The support pin 114 may be formed to protrude in an upward direction (the third direction 30) from the upper portion of the spin head 111. In this case, a plurality of support pins 114 may be disposed to be spaced apart from each other by a predetermined interval on the upper portion of the spin head 111.

The support pin 114 may be disposed to have an annular ring shape as a whole. The support pins 114 may support the bottom surface of the substrate W so that the substrate W may be spaced apart from the upper portion of the spin head 111 by a predetermined distance.

The guide pin 115 is a chucking pin, and may support the substrate W so that the substrate W does not deviate from its original position when the spin head 111 rotates. Similar to the support pin 114, the guide pin 115 may be formed to protrude in an upward direction (the third direction 30) from the upper portion of the spin head 111, and in this case, a plurality of guide pins 115 may be disposed to be spaced apart from each other by a predetermined interval on the upper portion of the spin head 111.

The guide pin 115 may be disposed farther from the center of the spin head 111 than the support pin 114. The guide pin 115 may be provided to be linearly movable between the standby position and the support position along the radial direction of the spin head 111. Here, the standby position means a position farther from the center of the spin head 111 compared to the support position.

The guide pin 115 may be moved to a standby position when the substrate W is loaded and unloaded from the substrate support unit 110, and may be moved to a support position when the substrate W is treated. The guide pin 115 may be in contact with the side portion of the substrate W at the support position.

Meanwhile, a back nozzle (not shown) may also be installed in the upper portion of the spin head 111.

The back nozzle is for cleaning the bottom surface of the substrate W. Such a back nozzle is installed in the upper center of the spin head 111, and may inject the substrate treating liquid to the bottom surface of the substrate W.

The substrate treating liquid recovery unit 120 recovers the substrate treating liquid used to treat the substrate W. The substrate treating liquid recovery unit 120 may be installed to surround the substrate support unit 110, and thus may provide a space, in which a treating process for the substrate W is performed.

After the substrate W is seated and fixed on the substrate support unit 110, when it starts to rotate by the substrate support unit 110, the injection unit 140 may inject the substrate treating liquid on the substrate W under the control of the control unit 150. Then, the substrate treating liquid discharged onto the substrate W due to the centrifugal force generated by the rotational force of the substrate support unit 110 may be dispersed in a direction, in which the substrate treating liquid recovery unit 120 is located. In this case, the substrate treating liquid recovery unit 120 may recover the substrate treating liquid when the substrate treating liquid is introduced therein through an inlet (i.e., the first opening unit 124 of the first recovery container 121, the second opening unit 125 of the second recovery container 122, the third opening unit 126 of the third recovery container 123, which will be described later).

The substrate treating liquid recovery unit 120 may include a plurality of recovery containers. The substrate treating liquid recovery unit 120 may include, for example, three recovery containers. When the substrate treating liquid recovery unit 120 is configured to include a plurality of recovery containers as described above, the substrate treating liquid used in the substrate treating process may be separated and recovered using the plurality of recovery containers, and accordingly, it may be possible to recycle the substrate treating liquid.

When the substrate treating liquid recovery unit 120 is configured to include three recovery containers, it may include a first recovery container 121, a second recovery container 122, and a third recovery container 123. The first recovery container 121, the second recovery container 12, and the third recovery container 123 may be implemented as, for example, a bowl.

The first recover container 121, the second recover container 122, and the third recover container 123 may recover different substrate treating liquids. For example, the first recovery container 121 may recover water, and the second recovery container 122 may recover a first chemical (e.g., at least one of a material containing an IPA component and a material containing an SPM component), and the third recovery container 123 may recover the second chemical (e.g., the other one of a material containing an IPA component and a material containing an SPM component).

The first recovery container 121, the second recovery container 122, and the third recovery container 123 may be connected to recovery lines 127, 128, 129 extending in a downward direction (the third direction 30) at the bottom surface thereof. The first treating liquid, the second treating liquid, and the third treating liquid recovered through the first recovery container 121, the second recovery container 122, and the third recovery container 123 may be treated to be reusable in a treating liquid regeneration system (not shown).

The first recovery container 121, the second recovery container 122, and the third recovery container 123 may increase in size from the first recovery container 121 toward the third recovery container 123 (that is, in the second direction 20). When the interval between the first recovery container 121 and the second recovery container 122 is defined as the first interval, and the interval between the second recovery container 122 and the third recovery container 123 is defined as the second interval, the first interval may be the same as the second interval. However, the present embodiment is not limited thereto. It is also possible that the first interval is different from the second interval. That is, the first interval may be greater than the second interval, or may be smaller than the second interval.

The first recovery container 121 may be provided in an annular ring shape surrounding the substrate support unit 110. In this case, the first opening unit 124 of the first recovery container 121 may function as an inlet for recovering the first treating liquid.

As shown in FIG. 2, the first recovery container 121 may include a first base 210, a first sidewall 220, a first upper plate 230, and a first inner wall 240.

FIG. 2 is a cross-sectional view specifically illustrating an internal structure of a first recovery container of a substrate treating liquid recovery unit constituting a substrate treating apparatus according to an exemplary embodiment of the present invention. The following description refers to FIG. 2.

The first base 210 constitutes the bottom plate of the first recovery container 121. The first base 210 may be connected to the first recovery line 127 to discharge the first treating liquid to the outside.

The first base 210 may be formed as a non-planar surface. The first base 210 may be, for example, formed to be inclined downwardly toward the center portion. When the first base 210 is formed in this way, as shown in FIG. 3, the first portion 211 of the first base 210 and the second portion 212 of the first base 210 may have different heights. For example, the first portion 211 may have a lower height than that of the second portion 212.

FIG. 3 is a first exemplary view illustrating various embodiments of a first base constituting the first recovery container shown in FIG. 2. The following description refers to FIG. 3.

The first portion 211 is a portion of the first base 210 and is connected to the first recovery line 127 installed in a lower portion of the first base 210. The first portion 211 may be, for example, a center portion of the first base 210.

The second portion 212 is another portion of the first base 210 and is not connected to the first recovery line 127. The second portion 212 may be, for example, a portion other than the center portion of the first base 210.

The second portion 212 may be formed to be inclined downwardly in a direction, in which the first portion 211 is located. In this case, the second portion 212 may be formed to be inclined downwardly in a direction, in which the first portion 211 is located, in a straight shape.

However, the present embodiment is not limited thereto. The second portion 212 may be formed to be inclined downwardly in the direction, in which the first portion 211 is located, in a curved shape as shown in the examples of FIGS. 4 and 5, or may be formed to be inclined downwardly in the direction, in which the first portion 211 is located, in a step shape as shown in FIG. 6. FIG. 4 is a second exemplary view illustrating various embodiments of the first base constituting the first recovery container shown in FIG. 2, and FIG. 5 is a third exemplary view illustrating various embodiments of the first base constituting the first recovery container shown in FIG. 2. In addition, FIG. 6 is a fourth exemplary view illustrating various embodiments of the first base constituting the first recovery container shown in FIG. 2.

Meanwhile, as shown in FIG. 7, only a part of the second portion 212 may be formed to be inclined downwardly in the direction, in which the first portion 211 is located. FIG. 7 is a fifth exemplary view illustrating various embodiments of the first base constituting the first recovery container shown in FIG. 2.

The conventional first base 310 is formed in a flat shape as shown in FIG. 8. However, when it is formed in a flat shape like the conventional first base 310, the amount of the substrate treating liquid flowing into the first recovery container 121 is very small, so that the substrate treating liquid cannot secure the minimum flow rate. Accordingly, the substrate treating liquid was deposited on the first base 310 and remained. FIG. 8 is a cross-sectional view showing the internal structure of the conventional first recovery container.

In this embodiment, in order to solve this problem, the first base 210 may be formed in a non-flat shape as shown in FIGS. 2 to 7. When the first base 210 is formed in such a non-flat shape, the discharge direction 410 of the substrate treating liquid becomes the same as the gravity direction 420 as shown in FIG. 9, and accordingly, natural drain by gravity may be possible. In addition, it is possible to reduce the amount of the remaining substrate treating liquid, and to increase the initial speed of the substrate treating liquid flowing into the flow path, thereby obtaining the effect of quickly cleaning the first recovery container 121. FIG. 9 is a view for describing the effect of the first recovery container installed according to an embodiment of the present invention.

On the other hand, the cross-sectional shape of the flow path formed in the first portion 211 (that is, the hole portion connected to the first recovery line 127 to discharge the substrate treating liquid to the outside) may be deformable to various shapes such as polygons, circles, ovals, etc. When the cross-sectional shape of the flow path is quadrangular, there is an effect of increasing the average flow rate of the substrate treating liquid, and in this embodiment, the cross-sectional shape of the flow path may be formed in a quadrangular shape in consideration of this point.

It will be described again with reference to FIG. 2.

When the first portion 211 and the second portion 212 are formed to be inclined in the first base 210, the inclination angle (or draft angle) between the first portion 211 and the second portion 212 may be greater than or equal to 20 degrees and less than 90 degrees. Preferably, the inclination angle between the first portion 211 and the second portion 212 may be 20 degrees or more and 70 degrees or less.

When the first portion 211 and the second portion 212 are formed to be inclined as described above, the initial inflowing rate of the substrate treating liquid may increase, and accordingly, the drain rate of the substrate treating liquid may increase. As a result, it may be possible to quickly clean the first recovery container 121 by reducing the residence time of the substrate treating liquid on the first base 210.

The first sidewall 220 constitutes the sidewall of the first recovery container 121. The first sidewall 220 may be formed to extend in an upward direction (third direction 30) from an end of the first base 210.

The first upper plate 230 constitutes the upper plate of the first recovery container 121. The first upper plate 230 may be formed to extend to be inclined upwardly in a direction away from the end of the first sidewall 220.

As shown in FIG. 8, the conventional first upper plate 330 is formed to include a tip 331 in its end. However, when it is formed to include a tip like the conventional first upper plate 330, the substrate treating liquid attached to the surface 332 formed to be curved by the tip 331 is not properly cleaned and remains continuously.

In this embodiment, in order to solve this problem, the end 231 of the first upper plate 230 may be formed in a shape, in which a tip is removed, as shown in FIG. 2. When the end 231 of the first upper plate 230 is formed in a shape, in which the width becomes narrower toward the end, a surface 332 formed to be curved by the tip no longer exists in the end 231 of the first upper plate 230, and thus, it is possible to obtain the effect of improving the cleaning efficiency and cleanliness level of the first recovery container 121.

On the other hand, the end 231 of the first upper plate 230 may be formed in a shape having a constant width.

The first inner wall 240 constitutes the inner wall of the first recovery container 121. The first inner wall 240 may be formed to extend in an upward direction (the third direction 30) from the end of the first base 210.

In this embodiment, if the first sidewall 220 is formed to extend in the third direction 30 from one end of the first base 210, the first inner wall 240 may be formed to extend in the third direction 30 from the other end of the first base 210. That is, the first inner wall 240 may be formed to face the first sidewall 220.

The conventional first inner wall 340 is formed by being coupled to the guide wall 350 as shown in FIG. 8. The guide wall 350 is formed to extend from an end of the first inner wall 340, and is spaced apart from the first sidewall 320 to be located inside the first sidewall 320. The guide wall 350 is formed to be inclined downwardly in a direction away from the end of the first inner wall 340. A space, in which the guide wall 350 and the first upper plate 330 are vertically spaced apart, is provided as a passage, through which the substrate treating liquid inflows.

When the conventional first inner wall 340 is formed by being coupled to the guide wall 350 in this way, the conventional first inner wall 340 may be formed to be inclined downwardly into the space formed by the combination with the first sidewall 320. However, when it is formed to be inclined downwardly into the space formed by the combination with the first sidewall 320 like the conventional first inner wall 340, a phenomenon, in which the substrate treating liquid attached to the surface 351 formed to be curved by the guide wall 350 is not properly cleaned and remained continuously, occurred.

In this embodiment, in order to solve this problem, as shown in FIG. 2, the first inner wall 240 may be formed to extend in an upward direction (the third directions 30) from the end of the first base 210 with the guide wall 350 removed. If the end 241 of the first inner wall 240 is not formed to be inclined downwardly in the inward direction as described above, but is formed to extend only in an upward direction, the surface 351 formed to be curved by the guide wall 350 no longer exists. Accordingly, it is possible to obtain the effect of improving the cleaning efficiency and cleanliness level of the first recovery container 121.

Meanwhile, a portion of the first inner wall 240 may protrude below the first base 210.

On the other hand, in the present embodiment, the first recovery container 121 may be formed by applying a loss of head. Specifically, as shown in FIG. 10, a height difference (Δh) may be generated between the third portion 213 and the fourth portion 214 of the first base 210.

FIG. 10 is a first exemplary view illustrating various embodiments of a first recovery container constituting a substrate treating apparatus according to an embodiment of the present invention. The following description refers to FIG. 10.

The third portion 213 is a portion of the first base 210 disposed on one side of the substrate support unit 110. The third portion 213 may be formed as a non-planar surface. The third portion 213 may include, for example, a first portion 211 connected to the first recovery line 127 and a second portion 212 adjacent to the first portion 211 and connected to the first portion 211.

The fourth portion 214 is a portion of the first base 210 disposed on the other side of the substrate support unit 110. The fourth portion 214 may be formed as a flat surface.

The third portion 213 may have a different height (Δh) from the fourth portion 214. Specifically, the third portion 213 may have a lower height than that of the fourth portion 214.

When a high viscosity or volatile substrate treating liquid remains a lot inside the first recovery container 121, particles may be generated on the substrate W by fumes or scattering. In particular, a substrate treating liquid such as a chemical may react with air to form a salt, and the salt may be attached to the inner wall of the first recovery container 121. When the foreign material as described above remains on the inner wall of the first recovery container 121, it may cause a defect in the substrate W.

In this embodiment, in order to solve the above problems, the height of the third portion 213 may be formed to be lower than the height of the fourth portion 214. When the loss of head is applied to the first recovery container 121 as described above, the average flow rate and drain rate of the substrate treating liquid increase, so that the substrate treating liquid can be quickly discharged to the outside, thereby increasing the cleaning speed.

The first recovery container 121 may be installed in a vertical direction (second direction 20) with respect to a height direction (third direction 30) of the substrate support unit 110. However, the present embodiment is not limited thereto. The first recovery container 121 may be installed to be inclined (tilted) at a predetermined angle with respect to the height direction of the substrate support unit 110. The first recovery container 121 may be, for example, installed to be tilted at a predetermined angle with respect to the height direction of the substrate support unit 110 during bowl cleaning.

When the first recovery container 121 is installed to be inclined at a predetermined angle with respect to the height direction of the substrate support unit 110, the third portion 213 of the first base 210 may be formed to have the same or similar shape as the fourth portion of the first base 210. That is, the third portion 213 of the first base 210 may be formed as a flat surface as shown in FIG. 12. FIG. 12 is a third exemplary view illustrating various embodiments of the first recovery container constituting the substrate treating apparatus according to the embodiment of the present invention.

However, the present embodiment is not limited thereto. The third portion 213 of the first base 210 may be formed to have a shape not similar to the fourth portion 214 of the first base 210. That is, the third portion 213 of the first base 210 may be formed as a non-planar surface as shown in FIG. 11. FIG. 11 is a second exemplary view illustrating various embodiments of a first recovery container constituting a substrate treating apparatus according to an embodiment of the present invention.

Meanwhile, when the first recovery container 121 is installed to be inclined at a predetermined angle with respect to the height direction of the substrate support unit 110, the inclination angle (θ) between the first recovery container 121 and the first line segment 430 may be greater than 0 degree and less than or equal to 45 degrees. Preferably, the inclination angle between the first recovery container 121 and the first line segment 430 may be greater than 0 degrees and less than or equal to 15 degrees. In the above description, the first line segment 430 refers to a line segment formed in a vertical direction with respect to the height direction of the substrate support unit 110.

It will be described again with reference to FIG. 1.

The second recovery container 122 may be provided in an annular ring shape surrounding the first recovery container 121. In this case, the second opening unit 125 of the second recovery container 122 may function as an inlet for recovering the second treating liquid.

As shown in FIG. 13, the second recovery container 122 may include a second base 510, a second sidewall 520, a second upper plate 530, and a second inner wall 540.

FIG. 13 is a cross-sectional view specifically illustrating an internal structure of a second recovery container among the substrate treating liquid recovery units constituting the substrate treating apparatus according to the exemplary embodiment of the present invention. The following description refers to FIGS. 1 and 13.

The second base 510 constitutes the bottom plate of the second recovery container 122. The second base 510 may be spaced apart from the first base 210 disposed thereon to face each other, and may be connected to the second recovery line 128 to discharge the second treating liquid to the outside.

Like the first base 210, the second base 510 may be formed as a non-planar surface. That is, the first portion 511 and the second portion 512 of the second base 510 may be formed to have the same or similar shape as the first portion 211 and the second portion 212 of the first base 210 described with reference to FIGS. 2 to 7.

The second sidewall 520 constitutes the sidewall of the second recovery container 122. The second sidewall 520 may be formed to extend in an upward direction (third direction 30) from an end of the second base 510. The second sidewall 520 may be spaced apart from the first sidewall 220 disposed in the inner side portion, and may face each other.

The second upper plate 530 constitutes the upper plate of the second recovery container 122. The second upper plate 530 may be formed to extend to be inclined upwardly in a direction away from the end of the second sidewall 520. The second upper plate 530 may be spaced apart from the first upper plate 230 disposed thereunder, and may face each other.

The second upper plate 530 may be formed to have the same or similar shape as the first upper plate 230 described with reference to FIG. 2. The end 531 of the second upper plate 530 may be formed, for example, in a shape, in which the tip is removed and the width becomes narrower toward the end.

The second inner wall 540 constitutes the inner wall of the second recovery container 122. The second inner wall 540 may be formed to extend in an upward direction (third direction 30) from an end of the second base 510. The second inner wall 540 may be spaced apart from the first inner wall 240 disposed thereon, and may be disposed on the same line as the first inner wall 240.

Meanwhile, a portion of the second inner wall 540 may protrude below the second base 510.

On the other hand, the second recovery container 122 may be formed by applying a loss of head, like the first recovery container 121. In this case, the second recovery container 122 may be formed to have the same or similar shape as the first recovery container 121 described with reference to FIGS. 10 to 12, and the third portion and the fourth portion of the second base 510 may be formed to have the same or similar shape as the third portion 123 and fourth portion 214 of the first base 210 described with reference to FIGS. 10 to 12.

The third recovery container 123 may be provided in an annular ring shape surrounding the second recovery container 122. In this case, the third opening unit 126 of the third recovery container 123 may function as an inlet for recovering the third treating liquid.

As shown in FIG. 14, the third recovery container 123 may include a third base 610, a third sidewall 620, a third upper plate 630, and a third inner wall 640.

FIG. 14 is a cross-sectional view specifically illustrating an internal structure of a third recovery container among the substrate treating liquid recovery units constituting the substrate treating apparatus according to the exemplary embodiment of the present invention. The following description refers to FIGS. 1 and 14.

The third base 610 constitutes the bottom plate of the third recovery container 123. The third base 610 may be spaced apart from the second base 510 disposed thereon to face each other, and may be connected to the third recovery line 129 to discharge the third treating liquid to the outside.

Like the first base 210, the third base 610 may be formed as a non-planar surface. That is, the first portion 611 and the second portion 612 of the third base 610 may be formed to have the same or similar shape as the first portion 211 and the second portion 212 of the first base 210 described with reference to FIGS. 2 to 7.

The third sidewall 620 constitutes the sidewall of the third recovery container 123. The third sidewall 620 may be formed to extend in an upward direction (the third direction 30) from the end of the third base 610. The third sidewall 620 may be spaced apart from the second sidewall 520 disposed on the inner side portion, and may face each other.

The third upper plate 630 constitutes the upper plate of the third recovery container 123. The third upper plate 630 may be formed to extend to be inclined upwardly in a direction away from the end of the third sidewall 620. The third upper plate 630 may be spaced apart from the second upper plate 530 disposed thereunder, and may face each other.

The third upper plate 630 may be formed to have the same or similar shape as the first upper plate 230 described with reference to FIG. 2. The end 631 of the third upper plate 630 may be formed, for example, in a shape, in which the tip is removed and the width becomes narrower toward the end.

The third inner wall 640 constitutes the inner wall of the third recovery container 123. The third inner wall 640 may be formed to extend in an upward direction (third direction 30) from an end of the third base 610. The third inner wall 640 may be spaced apart from the second inner wall 540 disposed thereon, and may be disposed on the same line as the first inner wall 240 and/or the second inner wall 540.

Meanwhile, a portion of the third inner wall 640 may protrude below the third base 610.

On the other hand, the third recovery container 123 may be formed by applying a loss of head, like the first recovery container 121. In this case, the third recovery container 123 may be formed to have the same or similar shape as the first recovery container 121 described with reference to FIGS. 10 to 12, and the third portion and the fourth portion of the third base 610 may be formed to have the same or similar shape as the third portion 213 and the fourth portion 214 of the first base 210 described with reference to FIGS. 10 to 12.

It will be described again with reference to FIG. 1.

The elevating unit 130 linearly moves the substrate treating liquid recovery unit 120 in the vertical direction (the third direction 30). The elevating unit 130 may serve to adjust the relative height of the substrate treating liquid recovery unit 120 with respect to the substrate support unit 110 (or the substrate W) through this.

The elevating unit 130 may include a bracket 131, a first support shaft 132, and a first driving unit 133.

The bracket 131 is fixed to the outer wall of the substrate treating liquid recovery unit 120. The bracket 131 may be coupled to the first support shaft 132 moved in the vertical direction by the first driving unit 133.

When the substrate W is seated on the substrate support unit 110, the substrate support unit 110 should be located above the substrate treating liquid recovery unit 120. Similarly, even when the substrate W is detached from the substrate support unit 110, the substrate support unit 110 should be located above the substrate treating liquid recovery unit 120. In this case, the elevating unit 130 may serve to lower the substrate treating liquid recovery unit 120.

When the treating process for the substrate W is performed, the treating liquid should be able to be recovered to any one of the first recovery container 121, the second recovery container 122, and the third recovery container according to the type of the substrate treating liquid discharged onto the substrate W. Even in this case, the elevating unit 130 may serve to elevate the substrate treating liquid recovery unit 120 to a corresponding position.

For example, when the first treating liquid is used as the substrate treating liquid, the elevating unit 130 may elevate the substrate treating liquid recovery unit 120 so that the substrate w is located at a height corresponding to the first opening unit 124 of the first recovery container 121.

In addition, when the second treating liquid is used as the substrate treating liquid, the elevating unit 130 may elevate the substrate treating liquid unit 120 so that the substrate W is located at a height corresponding to the second opening unit 125 of the second recovery container 122.

In addition, when the third treating liquid is used as the substrate treating liquid, the elevating unit 130 may elevate the substrate treating liquid unit 120 so that the substrate W is located at a height corresponding to the third opening unit 126 of the third recovery container 123.

Meanwhile, in the present embodiment, it is also possible that the elevating unit 130 linearly moves the substrate support unit 110 in the vertical direction so that the relative height of the substrate treating liquid recovery unit 120 with respect to the substrate support unit 110 (or the substrate W) is adjusted.

However, the present embodiment is not limited thereto. It is also possible that the elevating unit 130 linearly moves the substrate treating liquid recovery unit 120 and the substrate support unit 110 in the vertical direction at the same time so that the relative height of the substrate treating liquid recovery unit with respect to the substrate support unit 110 (or the substrate W) is adjusted.

The injection unit 140 supplies the substrate treating liquid onto the substrate W when the substrate W is treated. At least one injection unit 140 may be installed in the substrate treating apparatus 100. When a plurality of injection units 140 are installed in the substrate treating apparatus 100, each of the injection units 140 may inject different substrate treating liquids, such as a chemical, a rinse aid, and water, onto the substrate W.

The injection unit 140 may include a nozzle 141, a nozzle support unit 142, a second support shaft 143, and a second driving unit 144.

The nozzle 141 is installed at the end of the nozzle support unit 142. The nozzle 141 may be moved to a process position or a standby position by the second driving unit 144.

In the above, the process position refers to an upper region of the substrate W, and the standby position refers to the remaining region except for the process position. The nozzle 141 may be moved to a process position when discharging the substrate treating liquid onto the substrate W, and after discharging the substrate treating liquid onto the substrate W, the nozzle 141 may leave the process position and move to the standby position.

The nozzle support unit 142 supports the nozzle 141. The nozzle support unit 142 may be formed to extend in a direction corresponding to the longitudinal direction of the spin head 111. That is, the longitudinal direction of the nozzle support unit 142 may be provided along the second direction 20.

The nozzle support unit 142 may be coupled to a second support shaft 143 extending in a vertical direction with respect to the longitudinal direction of the nozzle support unit 142. The second support shaft 143 may be formed to extend in a direction corresponding to the height direction of the spin head 111. That is, the longitudinal direction of the second support shaft 143 may be provided along the third direction 30.

The second driving unit 144 rotates and elevates the second support shaft 143 and the nozzle support unit 142 interlocked with the second support shaft 143. According to this function of the second driving unit 144, the nozzle 141 may be moved to the process position or the standby position.

The control unit 150 controls the operation of the elevating unit 130 and the injection unit 140. Specifically, the control unit 150 may control the operations of the first driving unit 133 and the second driving unit 144.

Next, a method of cleaning the first recovery container 121, the second recovery container 122, and the third recovery container 123 (that is, a method of performing bowl cleaning) will be described.

First, a substrate W (e.g., a dummy wafer) is disposed on the spin head 111. At this time, it is also possible to proceed without the substrate W.

Thereafter, the cleaning target recovery container is lowered so as to be located lower than the substrate W. Here, the cleaning target recovery container may be at least one of the first recovery container 121, the second recovery container 122, and the third recovery container 123.

Thereafter, the spin head 111 is rotated and water (e.g., de-ionized water (DIW)) is injected on the upper and/or lower portions of the substrate W. Then, water is scattered by the rotational force of the spin head 111, so that the cleaning target recovery container can be efficiently cleaned.

In the present embodiment, when the cleaning target recovery container is cleaned, the height of the cleaning target recovery container may be adjusted. When the rotation speed of the spin head 111 is the reference speed, in the present embodiment, the height of the cleaning target recovery container may be adjusted to the reference height. When the rotation speed of the spin head 111 is faster than the reference speed, the height of the cleaning target recovery container may be set higher than the reference height. When the rotation speed of the spin head 111 is slower than the reference speed, the height of the clearing target recovery container may be set lower than the reference height.

In the present embodiment, water may be injected onto the substrate W or the spin head 111 using the injection unit 140. However, the present embodiment is not limited thereto. In the present embodiment, it is also possible to inject water on the substrate W or the spin head 111 using a nozzle installed in the substrate support unit 110.

The nozzle installed in the substrate support unit 110 is a chuck lower nozzle, and may be formed in an annular structure positioned smaller than an outer portion of the chuck. Since there are four or more discharge ports, the entire area of the cleaning target recovery container can be cleaned.

On the other hand, with a method of scattering on rotating objects such as a chuck and discharging it to the cleaning target recovery container, it can be discharged perpendicular to the lower portion of the chuck or obliquely toward the bowl.

The cleaning method as described above can be performed even when a substrate treating liquid other than the substrate treating liquid, which is the cleaning target, is being used in another recovery container, so that it can be used at any time without increasing the process time.

As another cleaning method, after the discharging of the substrate treating liquid is finished (that is, after the substrate W is treated using the substrate treating liquid), water is discharged onto the substrate W to clean the substrate W and the clearing target recovery container at the same time.

As another cleaning method, water is directly injected into the cleaning target recovery container using a nozzle installed in the substrate support unit 110 (e.g., a spray method, an oblique discharge method, etc.) to clean the cleaning target recovery container.

The substrate treating liquid recovery unit 120 and the substrate treating apparatus 100 having the same according to various embodiments of the present invention have been described above with reference to FIGS. 1 to 14. The substrate treating apparatus 100 has a structure, in which bowl cleaning is optimized. The substrate treating apparatus 100 can obtain the following effects.

First, it is possible to quickly remove the particle factor by improving the cleaning efficiency of the bowl.

Second, it is possible to secure the safety of the chamber by preventing contamination and chemical reactions in a chamber environment, in which various chemicals are mixed.

Third, it can be used for chemicals where high recovery rate is important because it requires recycle. In chemical recycle, one bowl can be used alone to prevent mixing with other chemicals. At this time, if impurities are included, the purity is lowered, so bowl cleaning technology is required. If high-purity chemical is recovered by applying bowl cleaning technology, the same amount of chemical can be used for more cycles, thereby reducing costs.

Fourth, during bowl cleaning, the height can be adjusted by driving the bowl or chuck lower nozzle with a motor, and bowl cleaning is possible by stage.

Fifth, it can be used when a chemical reaction occurs during mixing or when several chemicals of different properties need to be separated in one chamber. In particular, when exothermic or chemical explosion reaction occurs, the chamber safety can be secured by using the bowl cleaning technology.

The substrate treating apparatus 100 described above may be implemented as a cleaning system for cleaning the substrate W.

Although embodiments of the present invention have been described with reference to the above and the accompanying drawings, those of ordinary skill in the art to which the present invention pertains can understand that the present invention can be practiced in other specific forms without changing its technical spirit or essential features. Therefore, it should be understood that the embodiments described above are illustrative in all respects and not limiting.

What is claimed is:

1. An apparatus for treating a substrate comprising:
   a substrate support unit for supporting a substrate; and
   a substrate treating liquid recovery unit surrounding the substrate support unit, for recovering a substrate treating liquid discharged to the substrate, and including a first recovery container,
   wherein the first recovery container comprises a third portion disposed on one side of the substrate support unit and a fourth portion disposed on another side of the substrate support unit, each of the third portion and the fourth portion including:
   a first base;
   a first sidewall extending upwardly from one end of the first base;
   a first upper plate extending obliquely and upwardly from an end of the first sidewall; and
   a first inner wall extending upwardly from another end of the first base,
   wherein the third portion and the fourth portion have different heights,
   wherein the first base of the third portion includes a first portion and a second portion, the first portion connected to a first recovery line for discharging the substrate treating liquid to an outside, the second portion adjacent the first portion,
   wherein the first base of the fourth portion comprises a flat planar surface,
   wherein at least a part of the second portion of the first base extends obliquely relative to the flat planar surface and downwardly toward the first portion.

2. The apparatus of claim 1, wherein the fourth portion is higher than the third portion.

3. The apparatus of claim 1, wherein the second portion is formed to be inclined downwardly in a straight shape, formed to be inclined downwardly in a curved shape, or formed to be inclined downwardly in a step shape.

4. The apparatus of claim 1, wherein an inclination angle of the second portion with respect to the first portion is 20 degrees or more and 70 degrees or less.

5. The apparatus of claim 1, wherein the first base is installed in a vertical direction with respect to a height direction of the substrate support unit, or is installed to be tilted.

6. The apparatus of claim 5, wherein, when the first base is installed to be tilted, an angle formed between a longitudinal direction of the first base and a height direction of the substrate support unit is 15 degrees or less.

7. The apparatus of claim 1, wherein an end of the first upper plate has a narrower width toward an end.

8. The apparatus of claim 1, wherein the substrate treating liquid recovery unit further comprises:
   a second recovery container surrounding the first recovery container; and
   a third recovery container surrounding the second recovery container.

9. The apparatus of claim 8, wherein the first recovery container, the second recovery container, and the third recovery container recover different substrate treating liquids.

10. The apparatus of claim 8, wherein the first recovery container recovers water as the substrate treating liquid, and
    wherein the first inner wall is not coupled to a guide wall that is formed to be inclined downwardly in an inward direction.

11. The apparatus of claim 8, wherein the second recovery container comprises:
    a second base for discharging the substrate treating liquid to an outside through a second recovery line, and including a fifth portion disposed on one side of the substrate support unit and a sixth portion disposed on another side of the substrate support unit;
    a second sidewall extending upwardly from one end of the second base;
    a second upper plate extending obliquely and upwardly from an end of the second sidewall; and
    a second inner wall extending upwardly from another end of the second base,
    wherein the fifth portion and the sixth portion have different heights.

12. The apparatus of claim 8, wherein the third recovery container comprises:
    a third base for discharging the substrate treating liquid to an outside through a third recovery line, and including a seventh portion disposed on one side of the substrate support unit and an eighth portion disposed on another side of the substrate support unit;
    a third sidewall extending upwardly from one end of the third base;

a third upper plate extending obliquely and upwardly from an end of the third sidewall; and a third inner wall extending upwardly from another end of the third base, wherein the seventh portion and the eighth portion have different heights.

13. The apparatus of claim 1 further comprises an elevating unit for elevating the substrate treating liquid recovery unit.

14. The apparatus of claim 13, wherein the elevating unit adjusts a height of the substrate treating liquid recovery unit according to a rotation speed of the substrate support unit.

15. The apparatus of claim 1, wherein the substrate treating apparatus is a facility for wet cleaning the substrate.

16. The apparatus of claim 15, wherein at least one of an injection unit used for cleaning the substrate and a nozzle installed in the substrate support unit is used when cleaning the substrate treating liquid recovery unit.

17. An apparatus for treating a substrate comprising:

a substrate support unit for supporting a substrate; and a substrate treating liquid recovery unit surrounding the substrate support unit, for recovering a substrate treating liquid discharged to the substrate, and including a first recovery container, wherein the first recovery container comprises:

a first base for discharging the substrate treating liquid to an outside through a first recovery line, and including a third portion disposed on one side of the substrate support unit and a fourth portion disposed on another side of the substrate support unit; and a first sidewall extending upwardly from one end of the first base;

a first upper plate extending obliquely and upwardly from an end of the first sidewall;

a first inner wall extending upwardly from another end of the first base, wherein the third portion and the fourth portion have different heights, wherein the first base of the third portion includes a first portion and a second portion, the first portion connected to a first recovery line for discharging the substrate treating liquid to an outside, the second portion adjacent the first portion, wherein the first base of the fourth portion comprises a flat planar surface, wherein at least a part of the second portion of the first base extends obliquely relative to the flat planar surface and downwardly toward the first portion, and wherein an angle formed between the flat planar surface and a height direction of the substrate support unit is less than 90 degrees.

18. A substrate treating liquid recovery unit, wherein the substrate treating liquid recovery unit surrounds a substrate support unit for supporting a substrate and recovers a substrate treating liquid discharged to the substrate, wherein the substrate treating liquid recovery unit comprises a first recovery container, wherein the first recovery container comprises a third portion disposed on one side of the substrate support unit and a fourth portion disposed on another side of the substrate support unit, each of the third portion and the fourth portion including:

a first base;

a first sidewall extending upwardly from one end of the first base;

a first upper plate extending obliquely and upwardly from an end of the first sidewall; and a first inner wall extending upwardly from another end of the first base, wherein the third portion and the fourth portion have different heights, wherein the first base of the third portion includes a first portion and a second portion, the first portion connected to a first recovery line for discharging the substrate treating liquid to an outside, the second portion adjacent the first portion, wherein the first base of the fourth portion comprises a flat planar surface, wherein at least a part of the second portion of the first base extends obliquely relative to the flat planar surface and downwardly toward the first portion.

* * * * *